April 28, 1970 R. G. MANKARIOUS ET AL 3,509,428

ION-IMPLANTED IMPATT DIODE

Filed Oct. 18, 1967

INVENTORS.
RAMZY G. MANKARIOUS,
ROBERT W. BOWER,
ROBERT S. YING,

BY

W. Allister Jr.

ATTORNEY

United States Patent Office 3,509,428

Patented Apr. 28, 1970

3,509,428

ION-IMPLANTED IMPATT DIODE

Ramzy G. Mankarious, Costa Mesa, Robert W. Bower, Palos Verdes, and Robert S. Ying, Huntington Beach, Calif., assignors to Hughes Aircraft Company, Culver City, Calif., a corporation of Delaware Filed Oct. 18, 1967, Ser. No. 676,301
Int. Cl. H01l *1/12, 1/14*
U.S. Cl. 317—234 8 Claims

ABSTRACT OF THE DISCLOSURE

A high-frequency power diode including an ion-implanted region therein, and employing, respectively, thick (50 micron) silver pads as heat sink means at both contact surfaces, capable of being fabricated by simplified processing and providing microwave power with high-frequency stability.

This invention relates to high-frequency power diodes known as IMPATT diodes (IMPact Avalanche and Transit Time). More particularly, the invention relates to such diodes employing a heat sink means integral herewith. The device of the invention is especially useful as a high power microwave diode and the use of ion implantation techniques in processing results in an increased yield and reproducibility.

High-frequency power diodes of the type to which the present invention appertains are known to those skilled in the art, and are discussed by DeLoach in the Microwave Journal of July 1966, in an article entitled, "Microwave Solid State Sources."

Of existing types of semiconductor devices capable of generating appreciable microwave power, IMPATT diodes are reported to lead in high-power, high-frequency achievement. The referenced article, for example, indicates that the attainable power from solid state microwave devices falls off with frequency. For devices limited by avalanche breakdown, as is an IMPATT diode, the power output falls off approximately as $1/f^2$ in comparison with other devices such as tunnel diode and Gunn oscillators whose power falls off approximately as $1/f^{2.5}$.

This power-frequency relationship places emphasis on maximum carrier velocities in solids and maximum attainable voltage, which combined give the maximum rate at which energy can be delivered to carriers within a device. It follows that heat removal, surface breakdown, uniformity of materials and many other problems are also operational factors.

Heretofore, high-frequency power diodes have included in the fabrication process therefor the use of diffusion techniques to produce the p-n junction. Among the attendant problems have been thermal resistance, noise, nonuniform penetration depths affected by crystal defects, crystal damage from high temperatures, and nonuniform current distribution through the device. These difficulties and others are reduced in part by the use of ion implantation techniques.

It is therefore an object of the present invention to provide an improved high-frequency power diode.

Another object of the invention is to provide a high-frequency power diode which is characterized by improved capability for heat dissipation.

A further object of the invention is to provide a high-frequency power diode of improved configuration having a junction-forming surface and near-surface region of an epitaxially-formed layer with a high P-type conductivity, on a semiconductor substrate having a high N-type conductivity; and having a front metallic contact layer upon the surface and near-surface region of the epitaxially-formed layer with a high P-type conductivity; and a back metallic contact layer upon the back surface of the substrate, with at least the front contact layer being contiguous to, or touching, a heat sink means comprising a thick silver pad.

Still another object of the invention is to provide an improved method of fabrication of a high-frequency power diode.

These and other objects and advantages of the invention are realized in a diode structure by employing in one embodiment, for example: a front metallic contact layer applied to an immiscible layer of chromium; ("immiscible" in this usage pertains to immiscibility with silicon) to an ion-implanted epitaxial layer of boron on a silicon substrate, a pad of elemental silver is electroplated upon the surface of the front metallic contact layer on the back surface of the substrate.

It is to be understood that besides gold, nickel may be used for the metallic contact material. The contact metal may also be selected from chromium, molybdenum or titanium; however, if any of these three metals is used a layer of gold should be provided over such metal contacts in order to achieve good electrical contact to the silver pad to be mounted thereupon.

The device of the invention is characterized at least in part by an improved structure employing a heat sink means integral with the diode structure, contact to which heat sink means is uniform throughout, permitting heat transfer to be uniform over the surface of the contacts. The uniform temperature thus achieved furthers diode longevity and the reduction of noise.

Ohmic contact is made by means of two thick, elemental silver pads, which have higher thermal conductivity than alloys used heretofore. Further, because of the absence of alloys in the structure of the device which could alloy into silicon through the junction and cause short circuits, improved operation at higher temperatures is afforded.

Another advantage resulting in an improved structure derives from the use of the technique of ion implantation.

Fabrication of the device and the performance characteristics thereof will be described in detail hereinafter, in connection with a description of the structure of the device in a preferred embodiment thereof.

Before proceeding to a detailed description of the structure, fabrication and performance characteristics of the device of the invention, a brief explanation of ion implanation phenomena may be helpful.

In an ion implantation process, the impurity atoms are first ionized to furnish energy, then by means of a high-voltage electric field and/or magnetic field these ions may be formed into beams of various diameter and shapes and may also be caused to travel in predetermined directions at predetermined velocities. Hence in direct contrast to a conventional diffusion process—where available atoms are usually in vapor state, and may make contact with an exposed surface of a semiconductor body only in accordance with thermodynamic conditions present—conductivity-determining impurity ions may be made to enter a semiconductor surface film lattice in a predetermined direction at a predetermined velocity, and may be placed precisely therein in a prescribed concentration and controlled to a desired degree of uniformity or gradation.

The invention will be described in greater detail by reference to the drawings in which.

Figure 1:
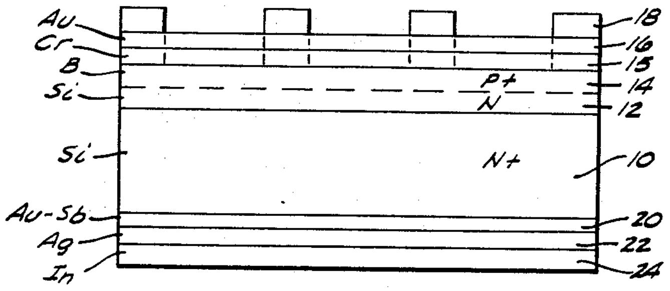
FIG. 1 is a schematic representation in end view of a plurality of diodes formed on a single semiconductor substrate, or wafer, subsequently to be diced to obtain discrete diodes according to the invention, and indicates the composition thereof.
Figure 2:
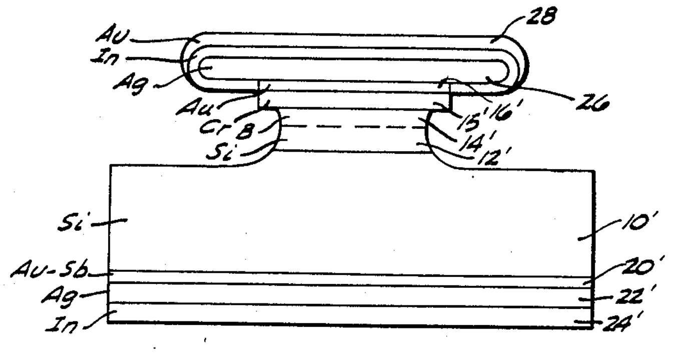
FIG. 2 is a schematic representation in end view of the invention after a mesa configuration has been formed and heat sink means have been applied at the junction.

Referring now to FIG. 1, a preferred embodiment of the device of the invention is illustrated in terms of its composition. Actually, as shown in FIG. 1, a large number of diodes are fabricated simultaneously on a silicon wafer which is subsequently diced up to form discrete diode devices as shown in FIG. 2. A heavily doped silicon semiconductor substrate 10 having a high N-type conductivity is a base for an epitaxially-formed layer 12 of silicon lightly doped and providing a somewhat less high N-type conductivity than that of the substrate 10. A region 14, having a high P-type conductivity, and formed by implanting into the epitaxially-formed layer 12, P-type conductivity ions or boron, for example, supports on the surface thereof an immiscible layer 15 of chromium on which is disposed a front metallic contact layer 16 of gold. Ion-implanted region 14 is annealed at a temperature higher than room temperature after implantation, and oxides formed and/or used in the implantation process are then removed. Photoresist masks 18 permit the etching out of parts of the immiscible layer 15 and then of the front metallic contact layer 16 to expose parts of the region 14 between the remaining gold and chromium contact areas.

After etching out parts 19 of the front metallic contact layers 15 and 16, masks 18 are chemically removed, leaving in situ gold contacts 16 which may be about 10 mils in diameter, for example. A back metallic contact layer 20 of gold-antimony is provided as ohmic contact on the back surface of the substrate 10, which in turn may be backed by heat sink means comprising a silver pad 22 having a plated indium layer 24 thereupon. Layer 20 is applied after the application of region 14 above described.

Referring now to FIG. 2, the immiscible layer 15' and the front metallic contact layer 16' are shown for convenience as solid layers. The sides of the epitaxially-formed layer 12 and the region 14 and the top of the substrate 10 have been etched away to form a mesa configuration as indicated. Upon the front metallic contact layer 16' is electroplated a thick silver pad 26 to serve as heat sink means which in turn is covered by a plated indium layer 28 as is also the case of the silver pad 22' on the back metallic contact which has a plated indium layer 24'. The indium layers 24' and 28 are included to enhance the contact between silver and the assembly or apparatus to which the diode is to be affixed. It is to be noted that silver does not adhere to, or plate, the exposed silicon in the interstices between the alloying layer and the front metallic contact layer because of the differences in plating potentials. It is further to be noted that the "mushroom" shape of the silver pad 26 is so designed in order that the overhang of the heat sink means will function uniformly over all areas of activity, at the periphery of the mesa as well as on the surface thereof.

It is to be understood that other materials may be acceptable in the fabrication of the device of the invention, as abovementioned, and that other dimensions may be acceptable; but the preferred embodiment illustrated and described herewith in FIGS. 1 and 2 is conceived with the dimensions shown in tabular form below:

| Layer | Ref. No. | Thickness |
|---|---|---|
| Substrate silicon | 10 | 100 microns. |
| Epitaxial silicon | 12 | 5 microns. |
| Ion-implanted boron | 14 | 0.3–1.0 microns. |
| Evaporated chromium | 15 | 0.3–0.4 microns. |
| Evaporated gold | 16 | 500 angstroms. |
| Plated silver pad | 22 and 26 | 50 microns. |
| Plated indium | 24 and 28 | 12 microns. |

There has thus been described an improved high-frequency power diode with heat sink capability useful in high power operations.

What is claimed is:

1. A high-frequency power diode comprising:
(a) a semiconductor substrate having a high N-type conductivity;
(b) an N-type semiconductor layer epitaxially formed upon said substrate and having a lower conductivity than that of said substrate;
(c) a surface and near-surface region of said first layer being ion-implanted so as to have high P-type conductivity;
(d) an immiscible metallic layer evaporated upon the surface of said epitaxially formed layer;
(e) a front metallic contact layer disposed on said immiscible metallic layer, and a back metallic contact layer upon the back surface of said substrate; and
(f) discrete mushroom shaped heat sink means contiguous to the surface of said front metallic contact layer.

2. The invention according to claim 1 wherein said substrate and said epitaxially formed layer are silicon (Si).

3. The invention according to claim 1 wherein said ion-implanted region is implanted with boron ions.

4. The invention according to claim 1 wherein the immiscible metallic layer is chromium.

5. The invention according to claim 3 wherein the metal for said front metallic contact layer is gold plated on said chromium layer.

6. The invention according to claim 1 wherein said heat sink means comprises discrete pads of elemental silver electroplated upon the surfaces of said metallic contacts and wherein said silver pads are plated with indium.

7. The invention according to claim 1 wherein said back contact comprises a layer of gold-antimony alloy contiguous to said substrate and having thereon thin layers of silver and indium in the order named.

8. The invention according to claim 7 wherein the thickness of said substrate is 100 microns; of said epitaxially formed layer 5 microns; of said ion-implanted region 0.3–1 micron; of said immiscible metallic layer 0.3–0.4 micron; of said front metallic contact layer 200 angstroms; of said back metallic contact layer on the back surface of said substrate 1000 angstroms; of said silver layer 50 microns; and of said plated indium layer 12 microns.

References Cited

UNITED STATES PATENTS

| | | | |
|---|---|---|---|
| 3,307,079 | 2/1967 | Eisenhower et al. | 317—101 |
| 3,381,185 | 4/1968 | Whitman et al. | 317—234 |
| 3,390,019 | 6/1968 | Manchester | 148—1.5 |
| 3,430,335 | 3/1969 | Gee | 29—588 |
| 3,457,471 | 7/1969 | Moroney et al. | 317—234 |

JOHN W. HUCKERT, Primary Examiner

R. F. POLISSACK, Assistant Examiner

U.S. Cl. X.R.

317—235